United States Patent
Pan et al.

(10) Patent No.: US 9,526,188 B2
(45) Date of Patent: Dec. 20, 2016

(54) ELECTRONIC DEVICE PACKAGE BOX

(71) Applicant: BOTHHAND ENTERPRISE INC., Tainan (TW)

(72) Inventors: Yung-Ming Pan, Taoyuan (TW); Chung-Cheng Fan, Taoyuan (TW)

(73) Assignee: BOTHHAND ENTERPRISE INC., Tainan (TW)

( * ) Notice: Subject to any disclaimer, the term of this patent is extended or adjusted under 35 U.S.C. 154(b) by 76 days.

(21) Appl. No.: 14/701,940

(22) Filed: May 1, 2015

(65) Prior Publication Data
US 2016/0183400 A1   Jun. 23, 2016

(30) Foreign Application Priority Data
Dec. 19, 2014  (TW) .............................. 103222541 U

(51) Int. Cl.
H05K 5/00      (2006.01)
H05K 7/02      (2006.01)
H05K 5/03      (2006.01)

(52) U.S. Cl.
CPC ............... *H05K 7/026* (2013.01); *H05K 5/03* (2013.01)

(58) Field of Classification Search
CPC ............... H04B 3/56; H04B 2203/547; H04B 2203/5483; H05K 5/03; H05K 3/0247; H05K 1/0271; H05K 7/02; H05K 2201/068; H01L 23/28; H01L 23/02

USPC ....... 361/728–730, 752, 796, 800, 735, 790; 257/767, 768, 788
See application file for complete search history.

(56) References Cited

U.S. PATENT DOCUMENTS

| | | | | |
|---|---|---|---|---|
| 5,861,666 A | * | 1/1999 | Bellaar | H01L 23/49827 257/686 |
| 6,137,163 A | * | 10/2000 | Kim | H01L 23/055 257/686 |
| 6,335,669 B1 | * | 1/2002 | Miyazaki | H01L 23/66 174/384 |
| 7,286,365 B2 | * | 10/2007 | Sarno | H01L 25/18 174/16.3 |
| 2006/0102997 A1 | * | 5/2006 | Bang | H01L 25/105 257/686 |
| 2006/0220224 A1 | * | 10/2006 | Cheng | H01L 25/105 257/706 |

* cited by examiner

*Primary Examiner* — Hung S Bui
(74) *Attorney, Agent, or Firm* — Muncy, Geissler, Olds & Lowe, P.C.

(57) ABSTRACT

An electronic device package box includes a first base unit including a first base and multiple first connecting pins, and a second base unit including a second base and multiple second connecting pins inserted into the first and second bases. The first base has a first abutment surface and a first pin-protruding surface. Each of the first connecting pins has a first wire-connecting portion projecting from the first pin-protruding surface. The second base has a second abutment surface abutting against the first abutment surface, and a second pin-protruding surface. Each of the second connecting pins has a second wire-connecting portion projecting from the second pin-protruding surface and a protrusion portion projecting from the first pin-protruding surface.

7 Claims, 5 Drawing Sheets

ELECTRONIC DEVICE PACKAGE BOX

CROSS-REFERENCE TO RELATED APPLICATION

This application claims priority of Taiwanese Application No. 103222541, filed on Dec. 19, 2014.

FIELD

This disclosure relates to a package box, more particularly an electronic device package box.

BACKGROUND

FIGS. 1 and 2 show a conventional electronic device package box 1 for mounting a plurality of first and second electronic components 10, 11 thereon. Each of the first electronic components 10 includes a hollow first core 101 and two first conducting wires 102 wound therearound. Each of the second electronic components 11 includes a hollow second core 111 and two second conducting wires 112 wound therearound. The electronic device package box 1 includes a base unit 12 mounted with the first electronic components 10, and a cover unit 13 mounted with the second electronic components 11. The cover unit 13 is connected to the base unit 12 and covers the first and second electronic components 10, 11.

The base unit 12 includes a base 121 and a plurality of first connecting pins 122 that are inserted into the base 121 and that are spaced apart from one another. The base 121 includes a base wall 123 for mounting the first electronic components 10 thereon, a first surrounding wall 124 extending from a peripheral region of the base wall 123 toward the cover unit 13, and an extending wall 125 extending from a bottom periphery of the base wall 123 oppositely of the base wall 123. The extending wall 125 is formed with a plurality of insertion holes 126 that are spaced apart from one another. Each of the first connecting pins 122 has a first embedded portion 127 embedded in the first surrounding wall 124, a first wire-connecting portion 128 connected to the first embedded portion 127 and projecting from the first surrounding wall 124 toward the cover unit 13, and a protrusion portion 129 connected to the first embedded portion 127 distally from the first wire-connecting portion 128 and projecting away from the cover unit 13. The first wire-connecting portion 128 of each of the first connecting pins 122 is entwined with one of the first conducting wires 102 of a corresponding one of the first electronic components 10.

The cover unit 13 includes a cover 131 corresponding in position to the base 121, and a plurality of second connecting pins 132 mounted on the cover 131. The cover 131 includes a cover wall 133 facing and being spaced apart from the base wall 123 of the base unit 12, and a second surrounding wall 134 extending from a periphery of the cover wall 133 toward the base unit 12 and abutting against the extending wall 125 of the base unit 12. The second electronic components 11 are mounted on the cover wall 133. Each of the second connecting pins 132 has a second embedded portion 135 embedded in the second surrounding wall 134, a second wire-connecting portion 136 connected to the second embedded portion 135 and projecting from the second surrounding wall 134 toward the base unit 12, an insertion portion 137 connected to the second wire-connecting portion 136 and inserted into a corresponding one of the insertion holes 126 of the extending wall 125, and a protrusion portion 138 connected to the insertion portion 137 and projecting away from the cover unit 13. The second wire-connecting portion 136 of each of the second connecting pins 132 is entwined with one of the second conducting wires 112 of a corresponding one of the second electronic components 11.

Although the conventional electronic device package box 1 can achieve its intended purpose of packaging and electrical connection, the second wire-connecting portion 136 of each of the second connecting pins 132 is connected to the insertion portion 137, and the insertion portion 137 is connected to the protrusion portion 138. Therefore, the protruding length of each of the second connecting pins 132 from the second surrounding wall 134 is relatively long, which makes entwining the second conducting wires 112 around the second wire-connecting portions 136 of the second connecting pins 132 an inconvenient task.

SUMMARY

Therefore, an object of the present disclosure is to provide an electronic device package box that can alleviate the aforementioned drawback associated with the conventional electronic device package box.

The electronic device package box is adapted to be mounted with a plurality of first and second electronic components, and includes a first base unit and a second base unit.

The first base unit includes a first base and a plurality of first connecting pins that are inserted into the first base and that are spaced apart from one another. The first base has a first abutment surface, a first mounting surface that is opposite to the first abutment surface in a stacking direction and that is adapted for mounting the first electronic components thereon, and a first pin-protruding surface that is spaced apart from the first abutment surface in the stacking direction and that surrounds the first mounting surface. Each of the first connecting pins has a first wire-connecting portion that projects from the first pin-protruding surface and that is electrically connected to one of the first electronic components.

The second base unit is connected to the first base unit in the stacking direction, and includes a second base and a plurality of second connecting pins. The second connecting pins are inserted into the first and second bases, and are spaced apart from one another. The second base has a second abutment surface that abuts against the first abutment surface of the first base, a second mounting surface that is opposite to the second abutment surface in the stacking direction and that is adapted for mounting the second electronic components thereon, and a second pin-protruding surface spaced apart from the second abutment surface in the stacking direction and that surrounds the second mounting surface. Each of the second connecting pins has a second wire-connecting portion that projects from the second pin-protruding surface and that is electrically connected to one of the second electronic components, and a protrusion portion that projects from the first pin-protruding surface of the first base.

BRIEF DESCRIPTION OF THE DRAWINGS

Other features and advantages of the present disclosure will become apparent in the following detailed description of the embodiment with reference to the accompanying drawings, of which.

DETAILED DESCRIPTION

Figure 1:
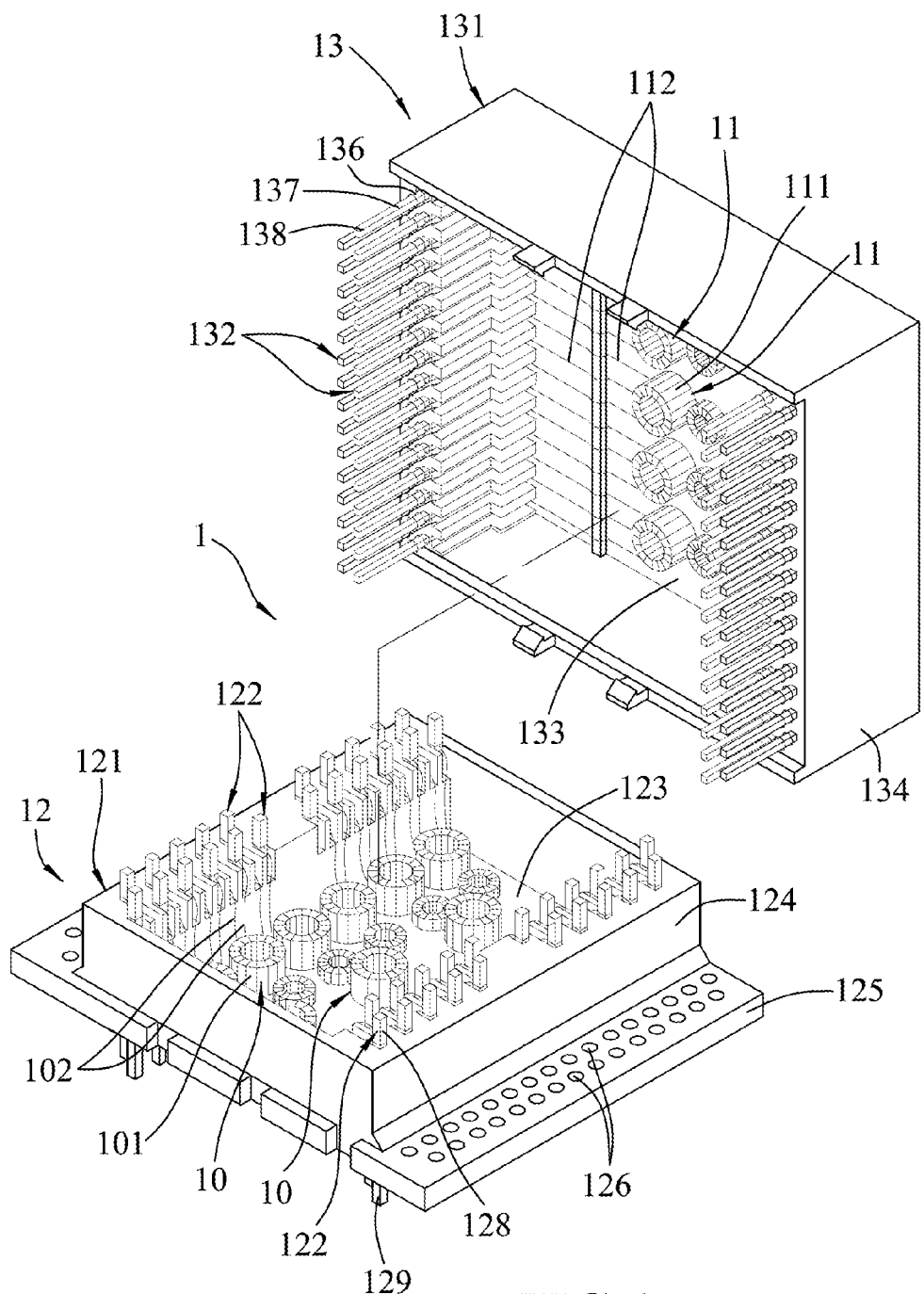
FIG. 1 is a partially exploded perspective view of a conventional electronic device package box.
Figure 2:
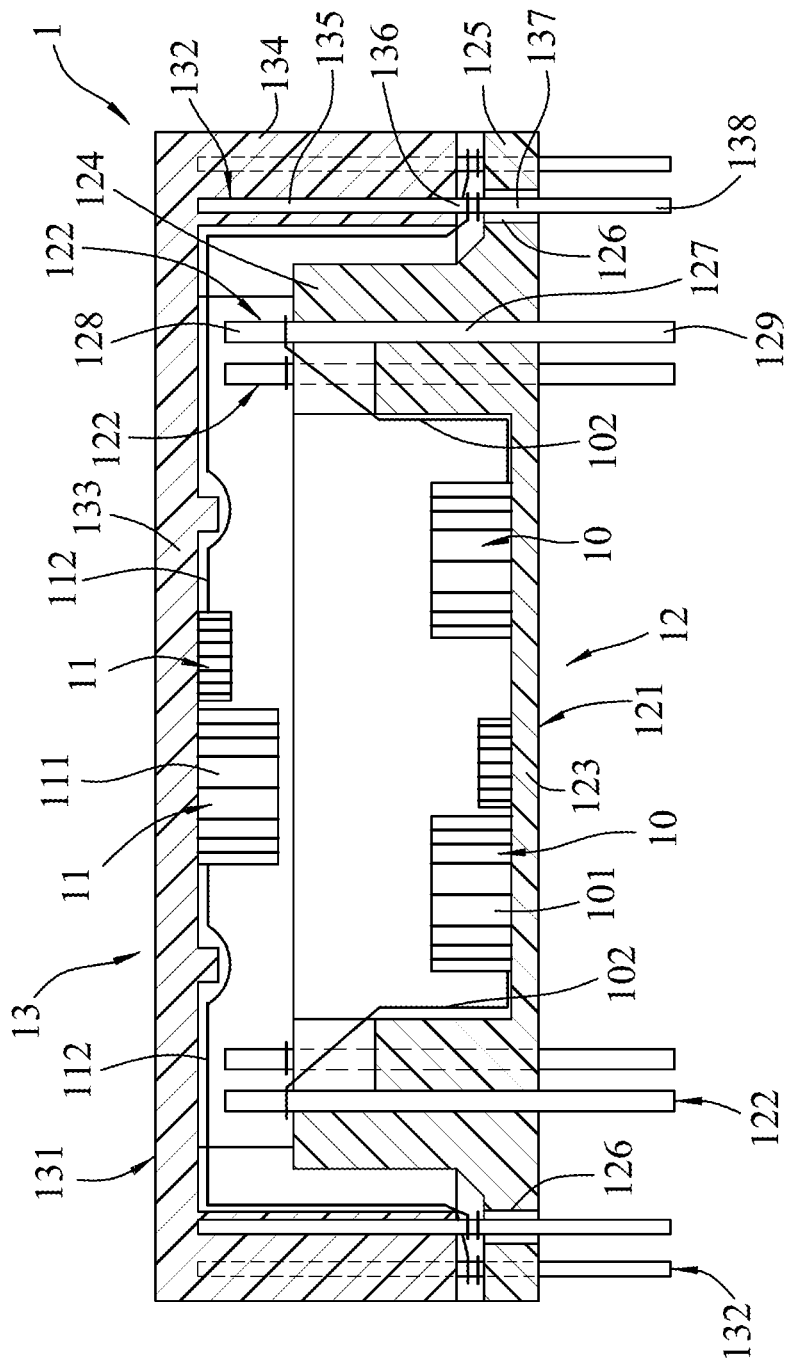
FIG. 2 is a cross-sectional view of the conventional electronic device package box.
Figure 3:
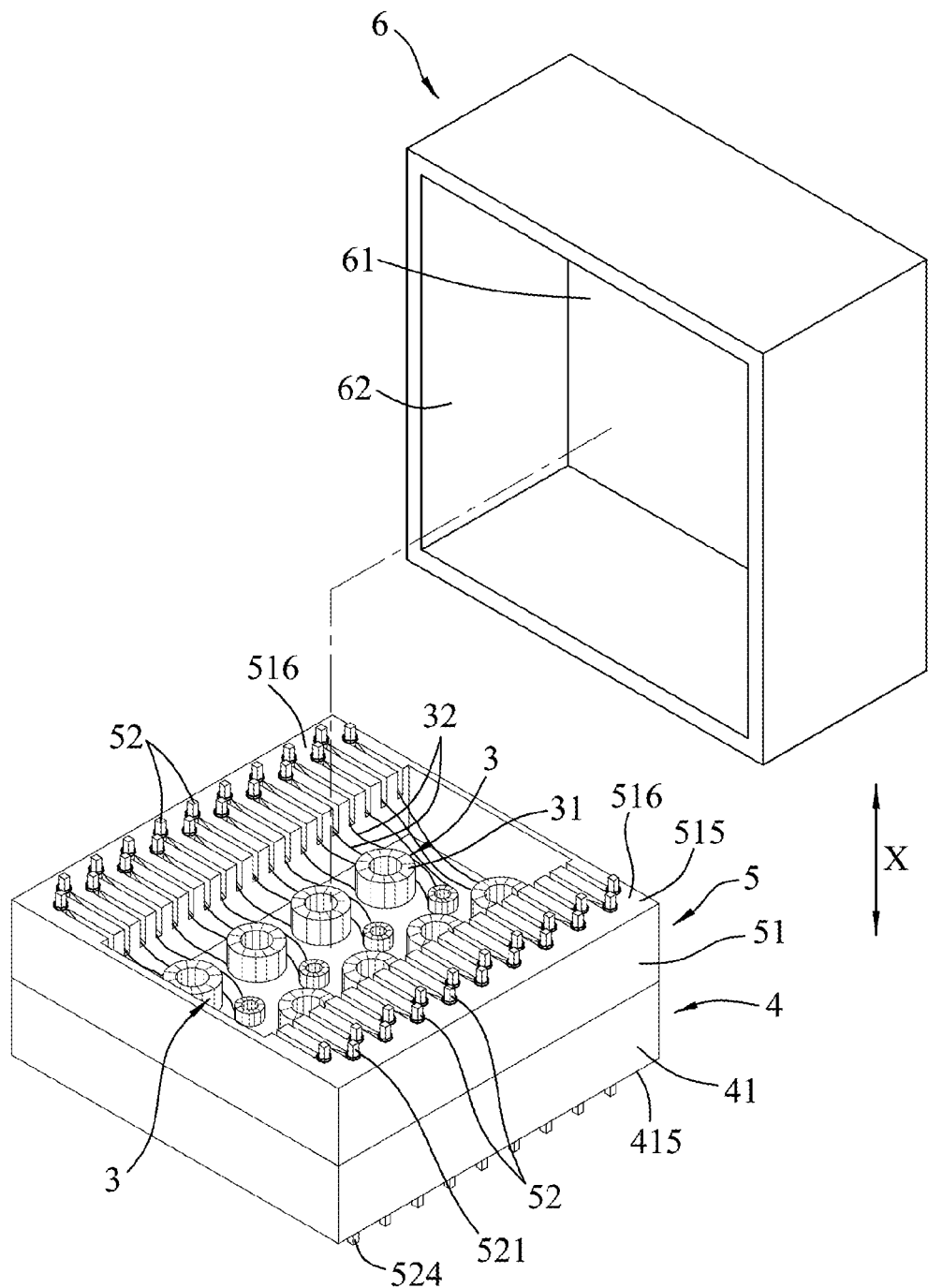
FIG. 3 is a partially exploded perspective view of an exemplary embodiment of an electronic device package box according to the disclosure.
Figure 4:
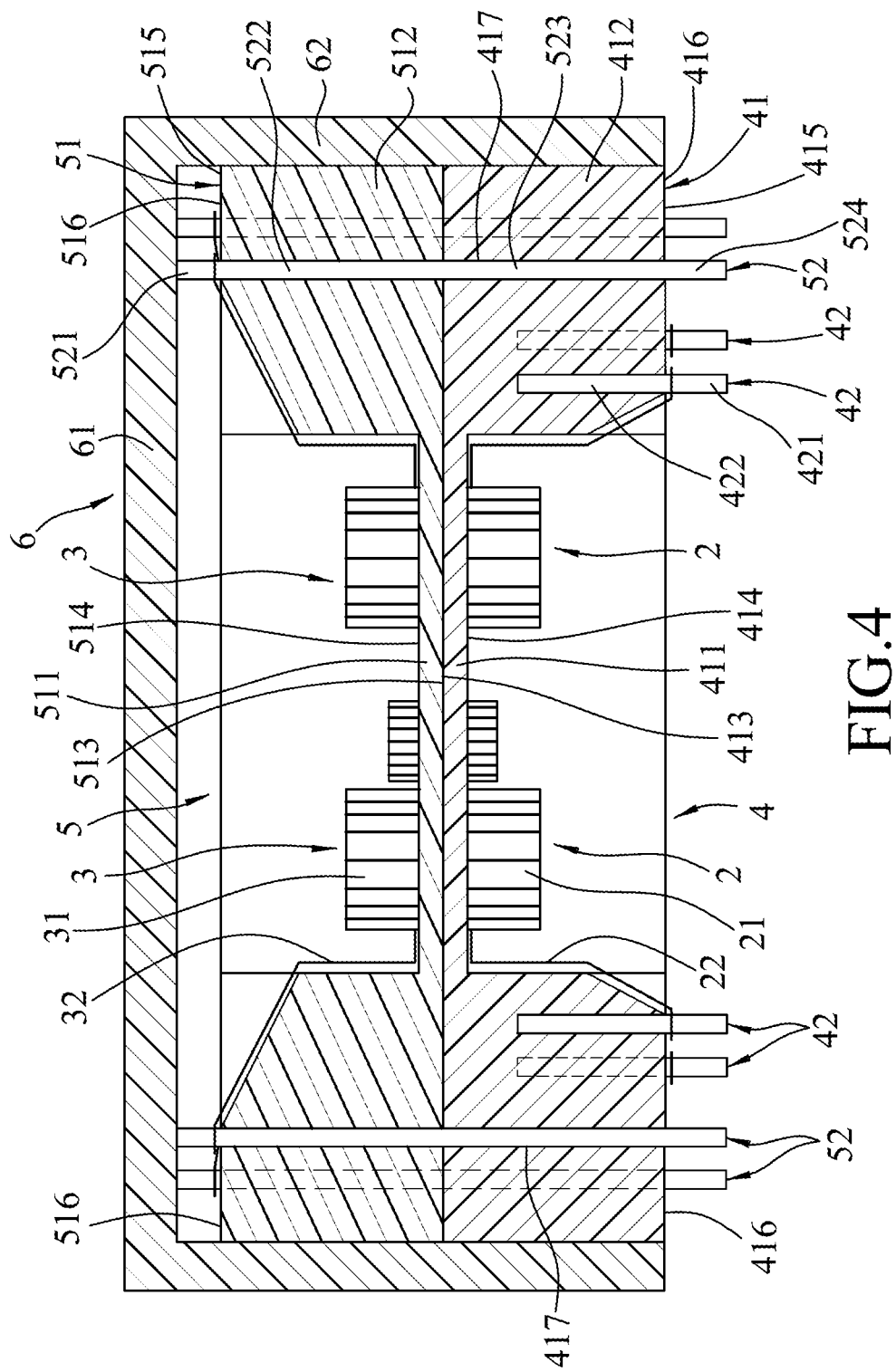
FIG. 4 is a cross-sectional view of the exemplary embodiment.
Figure 5:
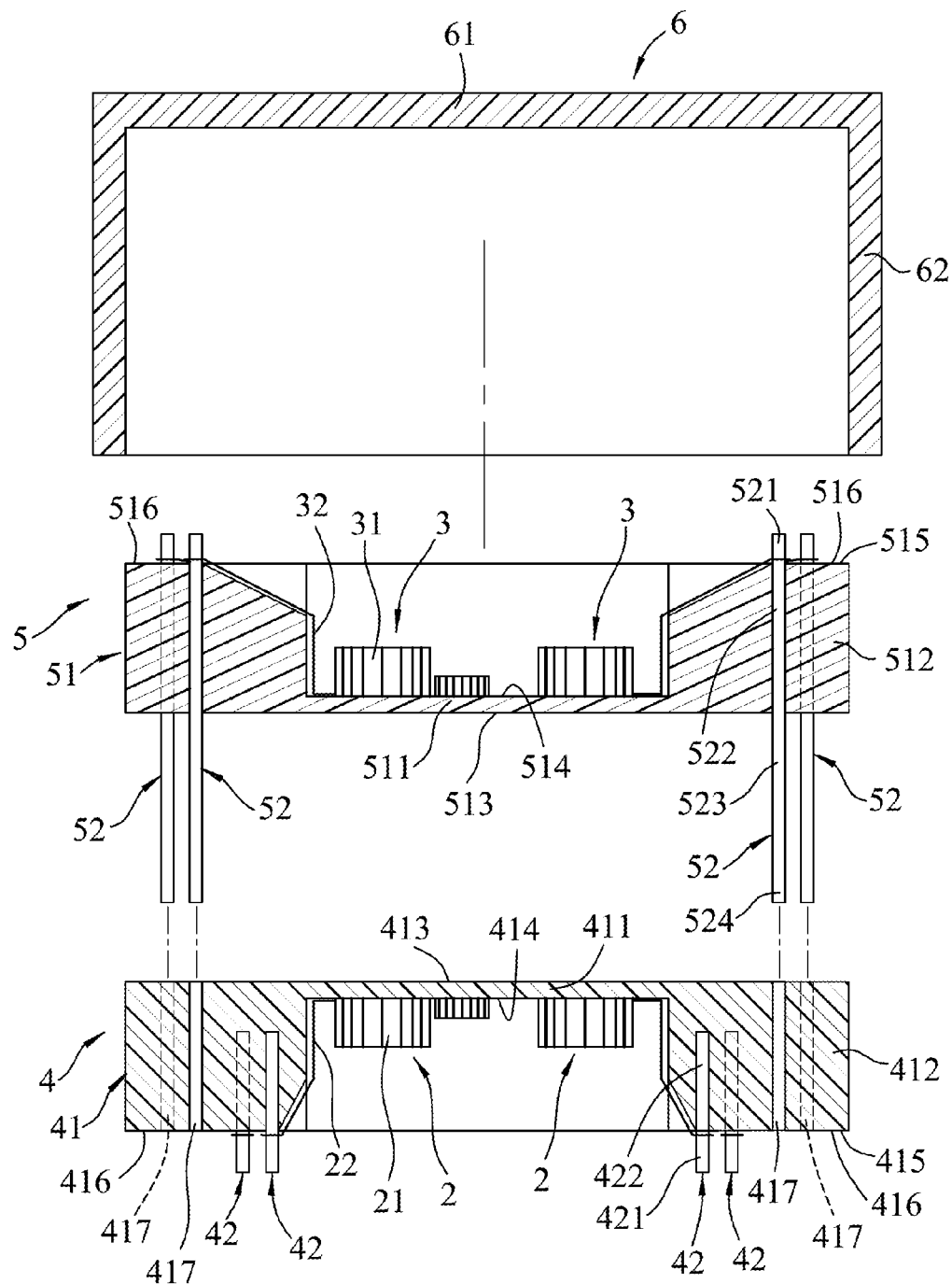
FIG. 5 is an exploded cross-sectional view of the exemplary embodiment.

Referring to FIGS. 3 to 5, an exemplary embodiment of an electronic device package box according to the present disclosure is adapted for mounting a plurality of first and second electronic components 2, 3 thereon. Each of the first electronic components 2 includes a hollow first core 21 and two first conducting wires 22 wound therearound. Each of the second electronic components 3 includes a hollow second core 31 and two second conducting wires 32 wound therearound. The configuration, type, number, arrangement and installation position of the first and second electronic components 2, 3 are not of the essence of the present disclosure, may be varied according to practical requirements, and therefore will not be further elaborated for the sake of brevity.

The electronic device package box includes a first base unit 4, a second base unit 5 connected to the first base unit 4 in a stacking direction (X), and a cover unit 6.

The first base unit 4 includes a first base 41 made of an electrically insulating plastic material, and a plurality of first connecting pins 42 inserted into the first base 41, spaced apart from one another, and made of conductive metal. The first base 41 is inverted-U-shaped and includes a horizontal first mounting wall 411 and a first surrounding wall 412 that extends from a peripheral region of the first mounting wall 411 oppositely of the second base 51. The first mounting wall 411 has a first abutment surface 413 and a first mounting surface 414 that is opposite to and disposed below the first abutment surface 413 in the stacking direction (X) and that is adapted to be mounted with the first electronic components 2 thereon. The first surrounding wall 412 has a first pin-protruding surface 415 that is spaced apart from and disposed below the first abutment surface 413 in the stacking direction (X), that surrounds the first mounting surface 414, and that has two opposite first regions 416. The first base 41 is formed with a plurality of insertion holes 417 that are defined between the first abutment surface 413 and the first pin-protruding surface 415.

Each of the first connecting pins 42 has a first wire-connecting portion 421 that projects from the first pin-protruding surface 415 and that is connected to one of the first conducting wires 22 of a corresponding one of the first electronic components 2, and a first embedded portion 422 that is embedded in the first surrounding wall 412 of the first base 41 and connected to the first wire-connecting portion 421. The first wire-connecting portions 421 of the first connecting pins 42 are divided into two groups. Each group of the first connecting portions 421 projects from a respective one of the first regions 415 and is arranged in two staggered rows.

The second base unit 5 includes a second base 51 made of an electrically insulating plastic material, and a plurality of second connecting pins 52 inserted into the first and second bases 51, 52, spaced apart from one another, and made of conductive metal. The second base 51 is U-shaped and includes a second mounting wall 511 that is disposed above and parallel to the first mounting wall 411 of the first base 41 in the stacking direction (X), and a second surrounding wall 512 that extends from a peripheral region of the second mounting wall 511 oppositely of the first base 41. The second mounting wall 511 has a second abutment surface 513 that abuts against the first abutment surface 413 of the first base 41, and a second mounting surface 514 that is opposite to and disposed above the second abutment surface 513 in the stacking direction (X) and that is adapted to be mounted with the second electronic components 3. The second surrounding wall 512 has a second pin-protruding surface 515 that is spaced apart from and disposed above the second abutment surface 513 in the stacking direction (X), that surrounds the second mounting surface 514, and that has two opposite second regions 516 respectively aligning with the first regions 416 of the first protruding surface 415.

Each of the second connecting pins 52 has a second wire-connecting portion 521, a second embedded portion 522, an insertion portion 523 and a protrusion portion 524. The wire-connecting portion 521 projects from the second pin-protruding surface 515 and is connected to one of the second conducting wires 32 of a corresponding one of the second electronic components 3. The second embedded portion 522 is embedded in the second surrounding wall 512 of the second base 51 and connected to the second wire-connecting portion 521. The insertion portion 523 interconnects the second embedded portion 522 and the protrusion portion 524, and is inserted into a corresponding one of the insertion holes 417 of the first base 41. The protrusion portion 524 projects from the first pin-protruding surface 415 of the first base 41. The second wire-connecting protrusions 521 of the second connecting pins 52 are divided into two groups. Each group of the second wire-connecting protrusions 521 projects from a respective one of the second regions 516 and is arranged in two staggered rows.

The cover unit 6 is made of an electrically insulating plastic material, and covers and surrounds the first and second bases 41, 51. The cover unit 6 includes a cover wall 61 and a side wall 62. The cover wall 61 faces and is spaced apart from the second mounting surface 514 and the second pin-protruding surface 515 of the second base 51, and covers the second wire-connecting portions 521 of the second connecting pins 52. The side wall 62 extends from a periphery of the cover wall 61 to surround the first and second bases 41, 51. It should be noted that the cover unit 6 further includes at least one engaging member (not shown) that is disposed on the side wall 62 and that engages detachably the first base 41. The engagement structure between the cover unit 6 and the first base 41 is not of the essence of the present disclosure and therefore will not be further elaborated for the sake of brevity.

When assembling the electronic device package box, the first cores 21 of the first electronic components 2 are mounted on the first mounting surface 414 of the first base 41. Each of the first conducting wires 22 of the first electronic components 2 are entwined around a corresponding one of the first wire-connecting portion s 421 of the first connecting pins 42. The second cores 31 of the second electronic components 3 are then mounted on the second mounting surface 514 of the second base 51. Each of the second connecting wires 32 of the second electronic components 3 are entwined around a corresponding one of the second wire-connecting portion s 521 of the second connecting pins 52. Excess length of the first and second connecting wires 22, 32 are cut off. A first tin welding process is applied among the first conducting wires 22 and the first wire-connecting portions 421, and the second conducting wires 32 and the second wire-connecting portions 521. An electrically insulating material (not shown) may be filled in the first and second bases 41, 51 for fixing and protecting the first and second electronic components 2, 3.

The insertion portion 523 of each of the second connecting pins 52 is inserted into a corresponding one of the insertion holes 417 of the first base 41 until the protrusion portion 524 protrudes from the first pin-protruding surface 415 and the second abutment surface 513 of the second base 51 abuts against the first abutment surface 413 of the first base 41. Then, the cover unit 6 covers the first and second bases 41, 51, and the at least one engaging member engages with the first base 41.

The first wire-connecting portion 421 of each of the first connecting pins 42 and the protrusion portion 524 of each of the second connecting pins 52 may be connected to an electric circuit board (not shown) and applied with a second tin welding process. The overall assembling process of the electronic device package box can be simplified by omitting the aforementioned first tin welding process.

To sum up, in the electronic device package box of the present disclosure, the first abutment surface 413 of the first base 41 and the second abutment surface 513 of the second base 51 abut against each other, and the first pin-protruding surface 415 and the second pin-protruding surface 515 face away from each other. Therefore, the second wire-connecting portion 521 and the protrusion portion 524 of each of the second connecting pins 52 could be designed to be at two opposite sides of the second base 51 so as to alleviate the drawback associated with the conventional electronic device package box.

While the disclosure has been described in connection with what is considered the exemplary embodiment, it is understood that this disclosure is not limited to the disclosed embodiment but is intended to cover various arrangements included within the spirit and scope of the broadest interpretation so as to encompass all such modifications and equivalent arrangements.

What is claimed is:

1. An electronic device package box adapted to be mounted with a plurality of first and second electronic components, comprising:

a first base unit including a first base and a plurality of first connecting pins that are inserted into said first base and that are spaced apart from one another, said first base having a first abutment surface, a first mounting surface that is opposite to said first abutment surface in a stacking direction and that is adapted to be mounted with the first electronic components, and a first pin-protruding surface that is spaced apart from said first abutment surface in the stacking direction and that surrounds said first mounting surface, each of said first connecting pins having a first wire-connecting portion that projects from said first pin-protruding surface and that is electrically connected to one of the first electronic components; and a second base unit connected to said first base unit in the stacking direction, and including a second base and a plurality of second connecting pins that are inserted into said first and second bases and that are spaced apart from one another, said second base having a second abutment surface that abuts against said first abutment surface of said first base, a second mounting surface that is opposite to said second abutment surface in the stacking direction and that is adapted to be mounted with the second electronic components, and a second pin-protruding surface that is spaced apart from said second abutment surface in the stacking direction and that surrounds said second mounting surface, each of said second connecting pins having a second wire-connecting portion that projects from said second pin-protruding surface and that is electrically connected to one of the second electronic components, and a protrusion portion that projects from said first pin-protruding surface of said first base.

2. The electronic device package box as claimed in claim 1, wherein said first base is formed with a plurality of insertion holes that are defined between said first abutment surface and said first pin-protruding surface, each of said first connecting pins further having a first embedded portion that is embedded in said first base and connected to said first wire-connecting portion, each of said second connecting pins further having a second embedded portion that is embedded in said second base and connected to said second wire-connecting portion, and an insertion portion that interconnects said second embedded portion and said protrusion portion, and that is inserted into a corresponding one of said insertion holes of said first base.

3. The electronic device package box as claimed in claim 2, wherein said first pin-protruding surface has two opposite first regions, said first wire-connecting portions of said first connecting pins being divided into two groups, each group of said first connecting portions projecting from a respective one of said first regions and being arranged in two staggered rows, said second pin-protruding surface has two opposite second regions, said second connecting portions of said second connecting pins being divided into two groups, each group of said second connecting portions projecting from a respective one of said second regions and arranged in two staggered rows.

4. The electronic device package box as claimed in claim 1, further comprising a cover unit that covers said first and second bases and that includes a cover wall and a side wall, said cover wall facing and being spaced apart from said second mounting surface and said second pin-protruding surface of said second base, and covering said second wire-connecting portions of said second connecting pins, said side wall extending from a periphery of said cover wall to surround said first and second bases.

5. The electronic device package box as claimed in claim 1, wherein said first base further includes a first mounting wall having said first abutment surface and said first mounting surface, and a first surrounding wall that extends from a peripheral region of said first mounting wall oppositely of said second base and that has said first pin-protruding surface, said second base further including a second mounting wall that has said second abutment surface and said second mounting surface, and a second surrounding wall that extends from a peripheral region of said second mounting wall oppositely of said first base and that has said second pin-protruding surface.

6. The electronic device package box as claimed in claim 5, wherein said first pin-protruding surface has two opposite first regions, said first wire-connecting portions of said first connecting pins being divided into two groups, each group of said first connecting portions projecting from a respective one of said first regions and being arranged in two staggered rows, said second pin-protruding surface has two opposite second regions, said second connecting portions of said second connecting pins being divided into two groups, each group of said second connecting portions projecting from a respective one of said second regions and arranged in two staggered rows.

7. The electronic device package box as claimed in claim 1, wherein said first pin-protruding surface has two opposite first regions, said first wire-connecting portions of said first connecting pins being divided into two groups, each group of said first connecting portions projecting from a respective one of said first regions and being arranged in two staggered rows, said second pin-protruding surface has two opposite second regions, said second connecting portions of said second connecting pins being divided into two groups, each group of said second connecting portions projecting from a respective one of said second regions and arranged in two staggered rows.

\* \* \* \* \*